United States Patent [19]

Hermann et al.

[11] 4,313,071

[45] Jan. 26, 1982

[54] PIEZO-ELECTRIC QUARTZ RESONATOR

[75] Inventors: Jean Hermann, Neuchatel; Claude Bourgeois, Bole, both of Switzerland

[73] Assignee: Centre Electronique Horloger S.A., Neuchatel, Switzerland

[21] Appl. No.: 73,559

[22] Filed: Sep. 7, 1979

[30] Foreign Application Priority Data

Sep. 8, 1978 [CH] Switzerland ............... 9442/78

[51] Int. Cl.³ ........................................... H01L 41/08
[52] U.S. Cl. ................................... 310/361; 310/320; 310/367; 310/346; 310/365
[58] Field of Search ............... 310/320, 361, 360, 367, 310/368, 370; 331/156, 158, 163

[56] References Cited

U.S. PATENT DOCUMENTS 4,178,566 12/1979 Kawashima ................... 310/370 X

Primary Examiner—Mark O. Budd
Attorney, Agent, or Firm—Cushman, Darby & Cushman

[57] ABSTRACT

The resonator according to the invention comprises at least one quartz crystal in the form of a rectangular thin plate, of which the length l is directed along an axis X', the width w along an axis Y' and the thickness t along an axis Z', and which vibrates in a contour mode. The axis Z' is situated in the plane of the electrical axis X and optical axis Z of the crystal and forms with the axis Z an angle $\phi$ such that $$16° < \phi < 36°$$

and the axis Y' forms with the mechanical axis Y of the crystal an angle $\theta$ such that $$10° < \theta < 30°$$

This resonator presents a zero temperature coefficient of the first order and is not dependent to any critical extent on the dimensional ratio between the sides w and l of the plate; the temperature coefficients of higher order are very small. The piezo-electric coupling is such that the optimized mode of oscillation is the only one excited in practice.

9 Claims, 8 Drawing Figures

PIEZO-ELECTRIC QUARTZ RESONATOR

FIELD AND BACKGROUND OF THE INVENTION

The present invention relates to a piezo-electric resonator comprising at least one quartz crystal in the form of a rectangular thin plate, of which the length l is directed according to an axis X', the width w according to an axis Y' and the thickness t according to an axis Z', and vibrating in a contour mode.

A contour mode resonator is realized in the form of a thin plate with displacement in the plane of the plate. The thickness has to be sufficiently small, so that the forces of inertia caused by the displacement outside the plane of the plate, due to crossed elastic constants, have a negligible influence on the energy of deformation. The shape which is most usually adopted is the rectangle, which implies the existence of four geometrical parameters:

- two angles of cut for defining the direction of the normal to the plate,
- one angle of cut for defining the orientation of the sides of the rectangle in the plane of the plate, and
- a dimensional ratio between the sides of the rectangle.

For a resonator to be of practical interest, it is necessary for its temperature coefficient of the first order to be close to 0 (for example, $\pm 1.10^{-6}$ /°C.) at the mean temperature of use.

Available on the market are quartz crystals of different cuts, among which the GT-cut is that which provides the most favorable thermal properties. What is involved here is a rectangular plate, of which the dimensional ratio is equal to 0.86, and which is obtained by a rotation about the electrical axis X of the crystal, followed by a rotation of $\pm 45°$ about the normal. The GT-cut resonator oscillates in accordance with a contour mode and more particularly in a width-extensional mode. The frequency temperature coefficients of the first order and of the second order are zero, and the coefficient of the third order is very small. The inconvenience arising from this cut is due to the fact that the thermal properties of the resonator are dependent in a critical manner on the dimensional ratio of the plate.

By way of example, as regards a GT-cut quartz crystal, the temperature coefficient of the first order $\alpha$ is equal to $\pm 0.1.10^{-6}$/°C., the coefficient of the second order $\beta$ is equal to $\pm 1.10^{-6}$/°C.$^2$ and the coefficient of the third order $\gamma$ is smaller than $30.10^{-12}$/°C.$^3$ However, it is to be noted that, for a relative variation $\Delta(w/l)/w/l$ of the dimensional ratio, equal to 1%, the variation of the temperature coefficient of the first order is equal to $2.5.10^{-6}$/°C. This implies that the temperature coefficient of a GT-cut quartz crystal necessarily has to be adjusted after fitting of the resonator.

Another known section or cut is the DT-cut, which consists of a generally square plate, obtained by a rotation about the electrical axis X and vibrating in face-shear mode. The DT-cut resonators have the advantage, relatively to those of GT-cut, of showing very little sensitivity to the variations of the dimensional ratio. However, their thermal properties are less satisfactory. By way of example, the temperature coefficient of the first order $\alpha$ is zero, the temperature coefficient of the second order $\beta$ is equal to $-(15$ to $20).10^{-9}$/°C.$^2$ and the temperature coefficient of the third order $\gamma$ is approximately equal to $45.10^{-12}$/°C.$^3$ AT-cut quartz crystals are also known, which are in the form of a plate obtained by a rotation about the electrical axis X of the crystal. The data concerning these quartz crystals are to be more particularly found in the publication "Quartz vibrators and their applications", by Pierre Vigoureux, edited by "His Majesty's Stationery Office", London, 1950. Two types of AT-cut quartz crystals, oscillating at a frequency of 4 MHz, are marketed at the present time. These are the AT-cut quartz crystal of Nihon Dempa Cie, of which the thermal properties at 25° C. are as follows:

Temperature coefficient of the first order:

$$\alpha = \pm 0.1.10^{-6}/°C.$$

Temperature coefficient of the second order:

$$\beta = -4 \pm 1.10^{-9}/°C.^2$$

Temperature coefficient of the third order:

$$\gamma = 95.10^{-12}/°C.^3$$

and the AT-cut quartz crystal of Société Suisse pour l'Industrie Horlogère (SSIH), of which the thermal properties at 25° C. are as follows:

Temperature coefficient of the first order:

$$\alpha = \pm 0.1.10^{-6}/°C.$$

Temperature coefficient of the second order:

$$\beta = -11 \pm 1.10^{-9}/°C.^2$$

Temperature coefficient of the third order:

$$\gamma = 90.10^{-12}/°C.^3$$

As well as the thermal properties being inferior to those of the GT-cut quartz crystals, the AT-cut quartz crystals have a frequency four times higher for a comparable size. On the other hand, the temperature coefficient of the first order is more sensitive to the differences in values of the angle of cut, e.g. for a variation $\Delta\phi$ of the angle $\phi$, equal to 1°, the corresponding variation $\Delta\alpha$ of the temperature coefficient of the first order is equal to $4.7.10^{-6}$/°C. In addition, the AT-cut quartz crystal of Nihon Dempa Cie, has a complicated shape, presenting a bevelling at each end of the bar and an inclination of the lateral faces. This involves the necessity of an individual metallization after complete machining. The AT quartz of SSIH has a considerable length, i.e. of about 11 mm.

An object of the present invention is to overcome the aforementioned disadvantages of the quartz crystals of known cuts and to provide a resonator of the type as initially indicated, which satisfies all the following conditions:

(a) Temperature coefficient of the first order $\alpha$ zero, controlled by a cutting angle and not dependent to any critical degree on the dimensional ratio of the crystal plate.

(b) Temperature coefficients of higher orders which are as small as possible, with in particular the possibility of cancelling out the temperature coefficient of the second order $\beta$.

(c) Sufficient piezo-electric coupling and fairly high motional capacitance $C_1$ for assuring an acceptable impedance level.

(d) Piezo-electric coupling of all the other modes sufficiently small for fulfilling the condition:

$$\frac{Q\,C_1}{\omega}\bigg|_{\text{optimised mode}} > \frac{Q\,C_1}{\omega}\bigg|_{\text{other modes}}$$

where Q represents the quality factor. This condition guarantees that only the optimised mode is excited by the oscillator.

(e) Use of a substrate obtained by a single crystallographic rotation, of which the influence on the temperature coefficient of the first order α should not be great, for example, less than $5.10^{-6}/°C$. per degree of angle.

(f) A second rotation, made about the normal to the plate, does not have to be critical and tolerances of the order of ±5' should be acceptable.

SUMMARY OF THE INVENTION

The resonator according to the invention is characterized in that the axis Z', normal to the large faces of the plate, is situated in the plane of the electrical axis X and optical axis Z of the crystal and forms with the axis Z an angle φ such that $$16° < \phi < 36°$$

and in that the axis Y' forms with the mechanical axis Y of the crystal an angle θ such that $$10° < \theta < 30°$$

BRIEF DESCRIPTION OF THE DRAWINGS

The accompanying drawings illustrate, by way of example, different embodiments of a resonator according to the invention.

DESCRIPTION OF THE PREFERRED EMBODIMENTS

Figure 1:
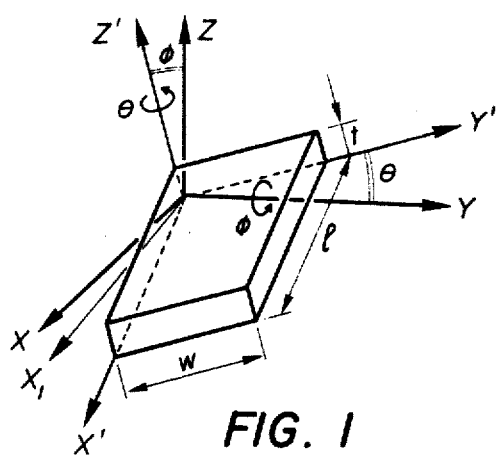
FIG. 1 is a perspective view showing the orientation of a resonator according to the invention in the system of axes X, Y, Z.

Referring to FIG. 1, the plate which is hereafter referred to as ZT-cut plate, is preferably obtained from a substrate of Z section, i.e. a plate having for its normal the optical axis Z of the quartz crystal. A first rotation of angle φ about the axis Y representing the mechanical axis of the crystal brings the optical axis Z into Z' and the electrical axis X into $X_1$. A second rotation of angle θ about the axis Z brings the axis $X_1$ into X' and the axis Y into Y'. The principal directions X', Y', Z' correspond respectively to the length l, the width w and the thickness t of the plate of ZT cut. In accordance with the IRE standard, such a cut is noted as (z x w t) φ, θ, which is interpreted in the following manner:

z: indicates the direction of the thickness of the initial plate (substrate of cut Z);

x: indicates the direction of the large dimension of the initial plate;

w: signifies that the first rotation of angle φ is effected about the axis bearing the width of the initial plate;

t: indicates that the second rotation of angle θ is effected about the direction of the thickness of the final plate (normal to the surface of the large faces).

In order to satisfy the conditions as previously stated, it is convenient to choose the angles φ and θ such that $$16° < \phi < 36°$$

$$10° < \theta < 26°$$

and the dimensional ratio w/l such that w/l is contained between 0.5 and 0.8.

The best results are obtained for φ approximately equal to 26°, θ approximately equal to 20° and w/l≅⅔. For reasons of symmetry as regards the crystal, it is established that, for the angular values: φ = −26° and θ = −20°, the plate obtained is identical with the former.

Figure 2:
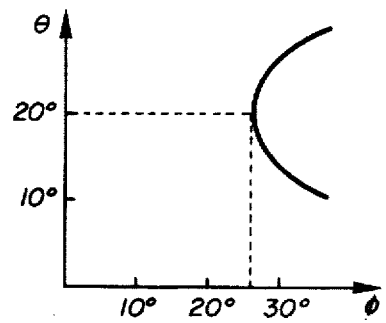
FIG. 2 is a graph representing the geometrical location of the values θ and φ for which the temperature coefficient of first order of the resonator is zero.

The thickness is a free parameter, as in all the contour modes. It has to be chosen in such a way as to avoid any troublesome coupling with the modes having movements outside the plane. Close to this combination of angles, it is found that the frequency/temperature relation is a cubic curve, of which the point of inflection can be varied by the appropriate choice of the dimensional ratio. The temperature coefficient of the first order at the point of inflection depends on the angle and can be cancelled. The temperature coefficient of the second order depends on the dimensional ratio and can be cancelled for w/l≅⅔. The temperature coefficient of the third order may only amount to about $55.10^{-12}/°C.^3$, that is to say, substantially less than that of a quartz crystal of cut AT. The frequency constant, related to the width, is 2823 KHz.mm. The curve of FIG. 2, which represents the geometrical position of the points for which the temperature coefficient of the first order is zero, illustrates very well the fact that this coefficient varies strongly with the angle φ, but shows very little sensitivity to small variations of the angle θ.

A detailed analysis of the properties of this ZT-cut quartz crystal makes it possible to show that the deformation is practically a pure elongation along the width, this implying that a juxtaposition along the axis Y' of n resonators, vibrating alternately in counter-phase, does not modify the thermal properties. The resonator as thus constituted does in fact vibrate on the $n^{th}$ harmonic of elongation along Y'.

The most simple constructional form of a ZT-cut resonator consists in using a rectangular quartz plate, such as that which is defined in FIG. 1, suspended by means of one or two wires, preferably placed at the centre. However, other possibilities do exist, which avoid the use of suspension wires or threads.

For example, a ZT-cut quartz crystal piezo-electric resonator in accordance with the invention may comprise a rectangular quartz plate having the following dimensions:

width, w: 2.7 mm.
length, l: 4.0 mm.
thickness, t: 0.2 mm,
the angles of cut φ and θ having the following values:
φ = 26°
θ = 20°

In this case, the value of the resonance frequency of the resonator is equal to $2^{20}$ Herz, i.e. about 1049 KHz.

Figure 3:
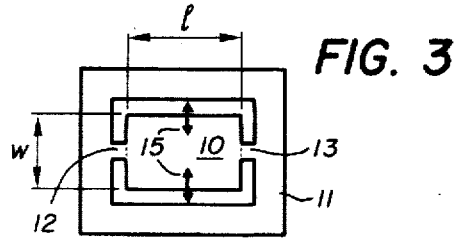
FIGS. 3 to 7 are plan views of five different forms of piezo-electric plates for the resonator.

Referring to FIG. 3, the ZT-cut quartz crystal shown therein comprises an interior active part 10 of length l and width w, enclosed by a frame 11 and fixed to this frame by two feet 12 and 13. The frame 11 and the feet 12 and 13 form the passive part of the crystal. The active part vibrates in the direction of the width, as indicated by the arrows 15.

Figure 4:
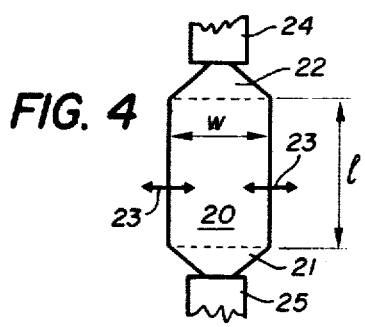

FIG. 4 illustrates another embodiment of a ZT-cut plate, which comprises a rectangular active part 20 of length l and width w, prolonged from each side of its longitudinal dimension by an extension 21, 22 which is triangular in shape. The plate vibrates in the direction of the arrows 23 and may as a result be easily fixed on two fixed supports 24 and 25, by the points of the respective triangles 21 and 22.

Figure 5:
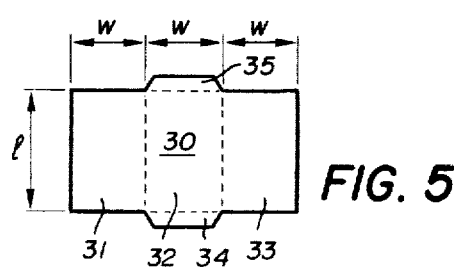

FIG. 5 illustrates a rectangular plate of ZT-cut, of which the active part 30 is equivalent, as regards its dimensions, to three plates 31, 32, 33 each having a length l and a width w, such that w/l=0.5 to 0.8. The central plate 32, disposed between the plates 31 and 33 and vibrating in counterphase, comprises for example two extensions 34 and 35 which are provided for fixing the assembly on a support (not shown).

Figure 6:
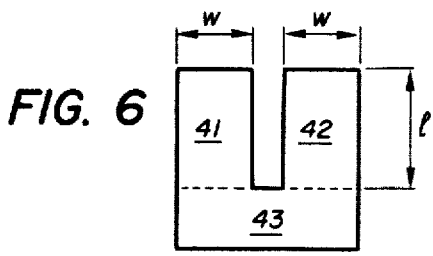

FIG. 6 illustrates a ZT-cut plate in the shape of a tuning-fork. It is composed of an active part which is formed of two plates 41 and 42 having a length l and a width w such that w/l=0.5 to 0.8, and fixed in parallel relation on a foot 43 which, in this case, constitutes the passive part and which is intended to be fixed on a support.

Figure 7:
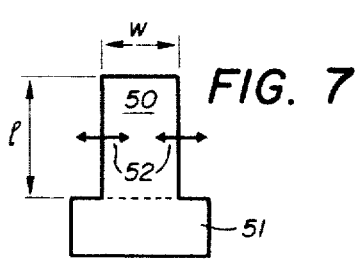

FIG. 7 shows another embodiment of a ZT-cut plate, comprising an active part 50 connected to a passive part 51. The active part is formed by a rectangular plate 35 having dimensions l and w which are such that the ratio w/l is equal to 0.5 to 0.8, as in the preceding Examples. The active part oscillates according to the arrows 52.

Figure 8:
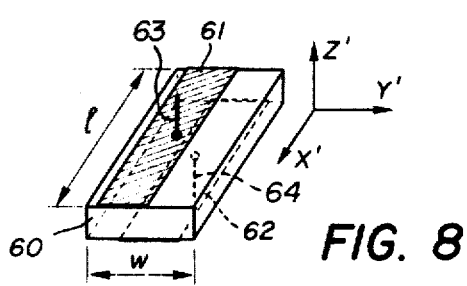
FIG. 8 is a perspective view of a resonator in the form of a rectangular plate, showing the location of the electrodes.

FIG. 8 illustrates one form of metallization of the ZT-cut plate. The low-consumption integrated oscillators have a negative resistance which is inversely proportional to the frequency. If an operation under linear running conditions is accepted, it is necessary for the quartz resonator to satisfy the following condition:

$$\frac{QC_1}{\omega}\bigg|_{\text{desired mode}} > \frac{QC_1}{\omega}\bigg|_{\text{undesired modes}}$$

The ZT resonator has in particular a shearing mode at lower frequency, for which this condition does not seem to be capable of being achieved if the plate is entirely metallized. It will therefore be necessary to have recourse to a partial metallization, chosen in such a way as to increase the ratio:

$$\frac{C_1 \mid ZT \text{ mode}}{C_1 \mid \text{shearing mode}}$$

This metallisation is formed by longitudinal strips 61 and 62, partially covering the large faces of the plate 60. One of the edges or margins of these strips may be merged with the margin of the plate. The strips 61 and 62 are necessarily offset relatively to the central plane perpendicular to the large faces of the plate in such a way that, if one of the metallisations, for example, the layer 61, is positively polarised and if the other 62 is negatively polarised, the resultant electric field presents one component along Y', which is opposite to its component along Z'.

The resonator which is shown in FIG. 8 is mounted by means of short suspension wires 63 and 64 which are electrical conductors, soldered perpendicularly at the centre of the two large faces of the quartz plate. These suspension wires also assure the electrical connection between the excitation circuits (not shown) and the respective metallised layers 61 and 62 of the quartz plate 60.

In addition to the advantages already previously described, the ZT-cut plate is simple to manufacture and does not require any adjustment of its thermal properties after it has been mounted. As possible adjustment of the frequency could be achieved simply by a uniform deposit of material, either over its entire surface, or preferably on a strip close to the edges which are parallel to the length of the plate, without the thermal properties being modified.

We claim:

1. Piezo-electric resonator comprising at least one quartz crystal in the form of a rectangular thin plate vibrating in a contour mode, wherein the cutting angle is within the range z x wt (16°-36°)/(10°-30°).

2. Resonator according to claim 1, wherein the ratio between the width w and the length l of the plate is between 0.5 n and 0.8 n, when n is the order of the harmonic of the fundamental mode of vibration being used.

3. Resonator according to claim 1, wherein the cutting angle is approximately z x wt 26°/20°.

4. Resonator according to claim 2, wherein the ratio w/l is approximately equal to ⅔n, when n is the order of the harmonic of the fundamental mode of vibration being used.

5. Resonator according to claims 1 or 2, comprising a quartz crystal having the form of a tuning-fork, of which the arms are formed by two rectangular plates having a ratio w/l of 0.5 to 0.8.

6. Resonator according to claims 1 or 2, comprising a quartz crystal having an active part which has the form of a rectangular plate equivalent as regards its dimensions to a plate composed of at least one rectangular plate having a ratio w/l of 0.5 to 0.8 and a passive part presenting at least one extension, the passive part being disposed adjacent to the active part.

7. Resonator according to claim 6, wherein the active part comprises a rectangular plate having a ratio w/l of 0.5 to 0.8 and the passive part comprises two triangles which prolong the active part in the length direction.

8. Resonator according to claim 3, wherein the active part comprises a rectangular plate having a ratio w/l of 0.5 to 0.8 and the passive part comprises a rectangular frame completely surrounding the active part, the two parts being connected to one another by means of extensions fast with each of the small sides of the active part.

9. Resonator according to claim 1, wherein the plate is partially metallised on each of its large faces, this metallisation having the form of a strip parallel to the length of the plate and these strips being offset from one another with respect to the central plane of the plate, this arrangement being so devised that if one of the metallisations is positively polarised and the other is negatively polarised, the electrical field presents one component along the axis Y', in a direction opposite ot its component along Z'.

* * * * *